United States Patent
Hunze et al.

(10) Patent No.: US 8,441,187 B2
(45) Date of Patent: May 14, 2013

(54) RADIATION-EMITTING DEVICE

(75) Inventors: Arvid Hunze, Kleinblittersdorf (DE); Chien-Shu Chiu, Taipei (TW); Ralf Krause, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/266,095

(22) PCT Filed: Apr. 22, 2010

(86) PCT No.: PCT/EP2010/055368
§ 371 (c)(1), (2), (4) Date: Apr. 10, 2012

(87) PCT Pub. No.: WO2010/122113
PCT Pub. Date: Oct. 28, 2010

(65) Prior Publication Data
US 2012/0187827 A1 Jul. 26, 2012

(30) Foreign Application Priority Data
Apr. 23, 2009 (DE) .......................... 10 2009 018 647

(51) Int. Cl.
*H01L 51/00* (2006.01)
(52) U.S. Cl.
USPC .......................................... 313/506; 428/690
(58) Field of Classification Search .......... 313/504–506; 428/690, 917
See application file for complete search history.

(56) References Cited

U.S. PATENT DOCUMENTS

| 2003/0178619 | A1 | 9/2003 | Forrest et al. |
| 2005/0196638 | A1 | 9/2005 | Son et al. |
| 2007/0222651 | A1* | 9/2007 | Hofer ............................ 341/120 |
| 2009/0230844 | A1 | 9/2009 | Pfeiffer et al. |
| 2011/0156059 | A1 | 6/2011 | Reineke et al. |

FOREIGN PATENT DOCUMENTS

| DE | 10 2007 020 644 | 11/2008 |
| DE | 10 2008 063 589 | 4/2010 |
| WO | WO 2005/029606 | 3/2005 |
| WO | WO 2006/097064 | 9/2006 |
| WO | WO 2006/130883 | 12/2006 |
| WO | WO 2008/054578 | 5/2008 |
| WO | WO 2010/046788 | 4/2010 |

OTHER PUBLICATIONS

G. Cheng et al., "Improved efficiency for white organic light-emitting devices based on phosphor sensitized fluorescence", Applied Physics Letters, AIP, American Institute of Physics, vol. 88, No. 8, pp. 83512-083512, XP012083026, 2006.

(Continued)

*Primary Examiner* — Joseph L Williams
(74) *Attorney, Agent, or Firm* — Cozen O'Connor

(57) ABSTRACT

A radiation-emitting device having comprising: a substrate (1); a first electrode (2) and a second electrode; (9), at least one emitter layer (5) arranged between the first and second electrodes and emitting light in the violet or blue spectral range, wherein the emitter layer comprises a matrix material and, relative to the matrix material, 0.1%-5% by weight of a fluorescent, radiation-emitting emitter and 1-30% by weight of a phosphorescent exciton trap; and wherein the emission maximum of the fluorescent emitter and that of the phosphorescent exciton trap being situated in the blue, violet or ultraviolet spectral range.

16 Claims, 2 Drawing Sheets

OTHER PUBLICATIONS

R. Holmes et al., "Saturated deep blue organic electrophosphorescence using a fluorine-free emitter", Applied Physics Letters, AIP, American Institute of Physics, vol. 87, No. 24, pp. 243507, XP012076904, 2005.

P. Erk et al., "Efficient Deep Blue Triplet Emitters for OLEDs", SID 06 Digest, 2006, pp. 131-134.

C. Schildknecht et al., "Percent progress in deep-blue phosphorescent OLEDs", Organic Light Emitting Materials and Devices XI, edited by Zakya H., Proc. SPIE 2007, vol. 6655, pp. 665502-1-665502-11.

C. Schildknecht et al., "Novel deep-blue emitting phosphorescent emitter", Proc. Of SPIE, vol. 5937, 2005.

Y. Sun et al., "Management of singlet and triplet excitons for efficient white organic light-emitting devices", Nature, vol. 440, 2006, pp. 908-912.

M.A. Baldo et al., "High-efficiency fluorescent organic light-emitting devices using a phosphorescent sensitizer", Nature, vol. 403, pp. 750-753, 2000.

* cited by examiner

RADIATION-EMITTING DEVICE

RELATED APPLICATIONS

This is a U.S. national stage of application No. PCT/EP2010/055368, filed on Apr. 22, 2010.

This application claims the priority of German application no. 10 2009 018 647.6 filed Apr. 23, 2009, the entire content of which is hereby incorporated by reference.

FIELD OF THE INVENTION

The present invention relates to a radiation-emitting device having an emitter layer which comprises a matrix material, a radiation-emitting fluorescent emitter, and an exciton trap.

BACKGROUND OF THE INVENTION

Highly efficient emitters with a very long life are one of the prerequisites for the development of high-efficiency organic light-emitting diodes (OLEDs) and for display and lighting applications. Critical to a high efficiency is the quantum efficiency of the individual emitter molecule and the quantum efficiency of the emitter system (made up of matrix and radiation-emitting emitter) overall. Long lives, however, cannot be realized equally for all emitted colors. Emitter layers which emit light in the violet or blue spectral range have significantly shorter lives than emitter layers which emit in the green, yellow, orange or red spectral range. This is true especially of phosphorescent emitters.

SUMMARY OF THE INVENTION

It is an object of the invention to provide a radiation-emitting device which has an emitter layer which emits in the violet or blue spectral range, with an improved quantum efficiency and a prolonged life.

This and other objects are attained in accordance with one aspect of the invention directed to a radiation-emitting device comprising a substrate, a first electrode, and a second electrode, and also an emitter layer, arranged between the first and second electrode, which (in operation) emits light in the violet and/or blue spectral range. This emitter layer comprises 0.1% to 5% by weight of a fluorescent, radiation-emitting emitter (which emits in the violet or blue spectral range) and 1% to 30% by weight of a phosphorescent exciton trap. Besides the fluorescent, radiation-emitting emitter and the phosphorescent exciton trap, the emitter layer has a matrix material (which is the reference basis for the figures in % by weight). Generally speaking, the weight fraction of the exciton trap is greater than that of the fluorescent emitter. The emission maximum of the fluorescent emitter is situated in the blue or violet spectral range, that of the phosphorescent exciton trap in the blue, violet or ultraviolet spectral range.

By means of the emitter layer according to an embodiment of the invention, additionally comprising, besides the matrix material and the fluorescent emitter, a phosphorescent exciton trap, it is possible to improve the quantum efficiency and the power efficiency. Generally speaking, the presence of the phosphorescent exciton trap and of the fluorescent emitter also results in a better charge carrier equilibrium and a lower voltage—in other words, an improved current efficiency.

The individual components of the radiation-emitting device of the present invention are elucidated in more detail below.

A "substrate" in accordance with the present invention comprises, for example, a substrate as used conventionally in the prior art for a radiation-emitting device. For example, the substrate may comprise glass, quartz, polymeric films, metal, metallic foils, silicon wafers or another suitable substrate material. Where the radiation-emitting device is configured, for example, as what is called a "bottom emitter", the substrate is preferably transparent and configured, for example, as a glass substrate. In the radiation-emitting device of the invention, the first electrode may be deposited on the substrate.

The "first electrode" as used herein may in one case be an anode. The anode may consist of a hole-injecting material. As hole-injecting material it is possible to use any hole-injecting material known in the prior art. Where the radiation-emitting device is designed, for example, as a "bottom emitter", the anode consists typically of a transparent material. For example, it may consist of transparent conductive oxides or may comprise a layer of such oxides. These transparent conductive oxides (TCOs) include metal oxides, such as zinc oxide, tin oxide, cadmium oxide, titanium oxide, indium oxide or indium tin oxide (ITO), $Zn_2SnO_4$, $CdSnO_3$, $ZnSnO_3$, $MgIn_2O_4$, $GaInO_3$, $Zn_2In_2O_5$ or $In_4Sn_3O_{12}$, for example, or mixtures of different transparent conductive oxides, but are not restricted to these examples. The TCOs here are not mandatorily subject to a stoichiometric composition, and may also, furthermore, be p- or n-doped.

If the first electrode is an anode, the second electrode is a cathode. The "cathode" may consist of an electron-injecting material. As cathode materials it is possible to use cathode materials that are customary in the prior art, more particularly aluminum, barium, indium, silver, gold, magnesium, calcium or lithium, and also compounds, and alloys of these substances, and mixtures of the aforementioned elements, compounds and/or alloys. Alternatively or additionally it is also possible for one or more of the TCOs referred to for the anode materials to be included or for the cathode also to consist entirely of one of these materials. The cathode, accordingly, can also be of transparent configuration.

In the radiation-emitting device, for example, one electrode may be transparent in its configuration, and the other reflecting. The radiation-emitting device may therefore be configured either as a "bottom emitter" or as a "top emitter". As an alternative to this, it is also possible for both electrodes to be of transparent configuration.

The emitter layer of the radiation-emitting device of the invention identifies a functional layer composed of a matrix material which comprises one or more fluorescent emitters and one or more phosphorescent exciton traps or consists of the matrix material, the at least one emitter, and the at least one exciton trap.

The phosphorescent exciton trap is a compound to which efficient energy transfer from the matrix material is possible. The function the exciton trap then is that of ensuring efficient and rapid energy transfer to the emitter material, i.e., of transferring excitons to said emitter material. Although the exciton trap is a phosphorescent compound, it is in particular not important that the exciton trap emits radiation; what is essential, instead, is that the exciton trap ensures effective transport of the excitons (and as far as possible of the charge carriers as well). The materials used as exciton traps are always different from the materials used as emitters.

In accordance with the invention it has been observed that excitons are formed on the matrix molecules (or exciton traps), and the triplet excitons formed on the matrix molecules are "captured" by the exciton traps; the excitons are subsequently transferred to the (singlet state of the) fluorescent emitter. By this means, at least partly, the triplet excitons of the phosphorescent exciton trap can be utilized for radiation on the fluorescent emitter without undergoing radiative or nonradiative recombination on the phosphorescent emitter. In accordance with the invention, therefore, it has been recognized that with the emitter layer of the invention it is possible to combine the high efficiency of the phosphorescent exciton trap (emitting in the blue range, for example) with the high long-term stability of the fluorescent (especially blue) emitter. In accordance with the prior art, in contrast, either emitter layers with phosphorescent emitters are used, in which the quantum efficiency recorded is indeed good, since the triplet excitons as well are able to recombine radiatively, but which (in the case of the blue emitters) possess a low long-term stability; alternatively, emitter layers with blue-fluorescent emitters are used, which possess a substantially higher long-term stability than phosphorescent blue emitters, but have a significantly lower quantum efficiency, since on these emitter materials only singlet excitons are able to undergo radiative recombination.

In the transfer cascade on which this exciton transfer is based, therefore, a triplet exciton generated on the matrix material or on the phosphorescent exciton trap is transferred ultimately to the singlet state of the fluorescent emitter. This is possible in particular in view of the fact that excitons, by virtue of the spin orbit coupling, generally constitute a mixture of triplet state and singlet state. In accordance with the invention, "triplet excitons" in particular, with a decay time <10 μs, are particularly suitable for transfer to the singlet level of the fluorescent emitter.

The higher concentration of the exciton trap ensures efficient energy transfer to the fluorescent emitters. As a result of the lower concentration of the emitter, in contrast, it is possible to prevent molecule stacking occurring, particularly in the case of emitters without steric hindrance; such stacking may result in a red shift of the emitted spectrum. The high concentrations of the exciton trap in contrast have the effect— in addition to those referred to above—that these exciton traps do not act as trap centers for the charge carriers; on the contrary, there may be good transport of the charge carriers.

Charge carrier transport may take place in particular by the matrix transporting the majority charge carriers and the exciton trap transporting the minority charge carriers with opposite charge (for example, in the case of a hole-transporting matrix, the electrons are transported via the LUMO of the exciton trap). In general, therefore, the radiation-emitting device of the invention also has an improved current efficiency. The current efficiency (as compared with emitter layers without exciton traps) is often increased by at least 10%. Frequently the current efficiency is even 20% and in many cases even 25% above the current efficiency of a corresponding emitter layer without the exciton trap of the invention. This is true especially of current efficiencies at high light intensities, i.e., light intensities which are typically greater than 1000 cd/m$^2$.

In summary it can be stated that in accordance with the invention it has been recognized that, through the combination of a phosphorescent exciton trap in high concentration and an emitter material in lower concentration, two effects can be realized independently of one another. First, this mixed system, in operation, initially transfers excitons from the matrix material to the exciton trap and/or forms them on the exciton trap. As a result of an efficient and rapid energy transfer, the triplet excitons are then transferred to the singlet level of the fluorescent emitter (with a prolonged life as compared with the phosphorescent exciton trap), on which radiative decay can take place. Furthermore, the exciton trap exhibits outstanding conduction properties for the minority charge carriers. Both effects result overall in a significantly increased quantum efficiency and also, in addition, in a better charge carrier equilibrium and in a lower voltage.

The fluorescent emitter and the exciton trap may each be embedded in a matrix material selected for example from the group consisting of mCP (1,3-bis(carbazol-9-yl)benzene), TCP (1,3,5-tris(carbazol-9-yl)benzene), TCTA (4,4',4"-tris(carbazol-9-yl)triphenylamine), TPBi (1,3,5-tris(1-phenyl-1-H-benzimidazol-2-yl)benzene), CBP (4,4'-bis(carbazol-9-yl)biphenyl), CDBP (4,4'-bis(9-carbazolyl)-2,2'-dimethylbiphenyl), DMFL-CBP (4,4'-bis(carbazol-9-yl)-9,9-dimethylfluorene), FL-4CBP (4,4'-bis(carbazol-9-yl)-9,9-bis(9-phenyl-9H-carbazole)fluorene), FL-2CBP (9,9-bis(4-carbazol-9-yl)phenyl)fluorene, also abbreviated as CPF), DPFL-CBP (4,4'-bis(carbazol-9-yl)-9,9-ditolylfluorene), FL-2CBP (9,9-bis(9-phenyl-9H-carbazole)fluorene), Spiro-CBP (2,2',7,7'-tetrakis(carbazol-9-yl)-9,9'-spirobifluorene), ADN (9,10-di(naphth-2-yl)anthracene), TBADN (3-tert-butyl-9,10-di(naphth-2-yl)anthracene), DPVBi (4,4'-bis(2,2-diphenylethen-1-yl)-4,4'-dimethylphenyl), p-DMDPVBi (4,4'-bis(2,2-diphenylethen-1-yl)-4,4'-dimethylphenyl), TDAF (tert(9,9-diarylfluorene)), BSBF (2-(9,9'-spirobifluoren-2-yl)-9,9'-spirobifluorene), TSBF (2,7-bis(9,9'-spirobifluoren-2-yl)-9,9'-spirobifluorene), BDAF (bis(9,9-diarylfluorene)), p-TDPVBi (4,4'-bis(2,2-diphenylethen-1-yl)-4,4'-di-(tert-butyl)phenyl), TPB3 (1,3,5-tri(pyren-1-yl)benzene, PBD (2-(4-biphenylyl)-5-(4-tert-butylphenyl)-1,3,4-oxadiazole), BCP (2,9-dimethyl-4,7-diphenyl-1,10-phenanthroline), BP-OXD-Bpy (6,6'-bis[5-(biphenyl-4-yl)-1,3,4-oxadiazo-2-yl]-2,2'-bipyridyl), NTAZ (4-(naphth-1-yl)-3,5-diphenyl-4H-1,2,4-triazole), Bpy-OXD (1,3-bis[2-(2,2'-bipyrid-6-yl)-1,3,4oxadiazo-5-yl]benzene), BPhen (4,7-diphenyl-1,10-phenanthroline), TAZ (3-(4-biphenylyl)-4-phenyl-5-tert-butylphenyl-1,2,4-triazole), PADN (2-phenyl-9,10-di(naphth-2-yl)anthracene), Bpy-FOXD (2,7-bis[2-(2,2'-bipyrid-6-yl)-1,3,4-oxadiazol-5-yl]-9,9-dimethylfluorene), OXD-7 (1,3-bis[2-(4-tert-butylphenyl)-1,3,4-oxadiazol-5-yl]benzene), HNBphen (2-(naphth-2-yl)-4,7-diphenyl-1,10-phenanthroline), NBphen (2,9-bis(naphth-2-yl)-4,7-diphenyl-1,10-phenanthroline), 3TPYMB (tris(2,4,6-trimethyl-3-(pyrid-3-yl)phenyl)borane), 2-NPIP (1-methyl-2-(4-(naphth-2-yl)phenyl)-1H-imidazo[4,5-f]-[1,10]phenanthroline), Liq (8-hydroxyquinolinolatolithium), and Alq (bis(2-methyl-8-quinolinolate)-4-(phenylphenolato) aluminum), and also of mixtures of the aforesaid substances. Preferred as matrix material are aromatic materials with a high nitrogen fraction, for instance the materials mCP, TCTA, TPBi, BCP, BPhen, CBP, CDBP and CPF (i.e., FL-2CBP), or metal complexes, for instance Alq. Where metal complexes are used as matrix material, they must not match the emitter material (or the exciton trap). Examples of suitable matrix materials present in the mixed system include mixtures of one or more of the materials TCTA, mCP, CBP, CDBP or CPF with one another, or mixtures with TPBi.

A blue-phosphorescent exciton trap may be selected from the group consisting of FIrPic (bis(3,5-difluoro-2-(2-pyridyl)phenyl-(2-carboxypyridyl)iridium (III))), FIr6 (bis(48,68-difluorophenylpyridinato)tetrakis(1-pyrazolyl)borate-iridiumIII), mer-Ir(dpbic)$_3$ (mer-iridium(III) tris(1,3-diphenylbenzimidazolin-2-ylidene-C,C2')), mer-Ir(cn-pmic)$_3$ (mer-irdium(III) tris(1-methyl-3-p-cyanophenylimidazolin-2-ylidene-C,C2')), mer-Rh(cn-pmic)$_3$ (mer-rhodium(III) tris(1-methyl-3-p-cyanophenylimidazolin-2-ylidene-C,C2')), Pt(cn-pmic)acac (platinum(II) (1-methyl-3-p-cyanophenylimidazolin-2-ylidene-C,C2') acetylacetonate), and also of mixtures of the aforesaid substances. The four last-mentioned substances are disclosed in P. Erk et al., SID06 Digest 2006, 131-134, and in the literature cited therein. The stated emitter materials have their emission maximum in the blue spectral range. Where, generally, an exciton trap or an emitter has two or more emission maxima, the emission maximum for the purposes of this invention is considered to be the emission maximum having the greatest intensity. Where two or more maximum-intensity emission maxima exist at different wavelengths for different current strengths, the maximum at the lower wavelength of these emission maxima is considered for the purposes of this invention to be the emission maximum (particularly for determining the difference between the wavelengths of the emission maximum of the radiation-emitting emitter and of the emission maximum of the exciton trap).

A blue-phosphorescent exciton trap may be selected from the group consisting of fac-Ir(Pmb)$_3$ (fac-iridium(III) tris(1-phenyl-3-methylbenzimidazolin-2-ylidene-C,C2')), mer-Ir(Pmb)$_3$ (mer-iridium(III) tris(1-phenyl-3-methylbenzimidazolin-2-ylidene-C,C2')), fac-Ir(dpbic)$_3$ (fac-iridium(III) tris(1,3-diphenylbenzimidazolin-2-ylidene-C,C2')—P. Erk et al., SID06 Digest 2006, 131-134—and also mixtures of the aforesaid substances. Exciton traps which have the emission maximum in the violet or ultraviolet spectral range are also disclosed in C. Schildknecht et al. "Organic Light Emitting Materials and Devices XI." edited by Kafafi, Zakya H., So, Franky, Proceedings of SPIE, volume 6655, pp. 665502 (2007) (SPIE=The International Society for Optical Engineering). The emission maximum of exciton traps of this kind is situated typically at a wavelength of at least 390 nm.

As fluorescent emitter it is possible to employ a compound which has the emission maximum in the violet or blue spectral range. The emission spectrum of the emitter may include further maxima; generally speaking, however, these will also be situated in the blue and/or violet spectral range.

As a blue-fluorescent emitter it is possible, for example, to use a compound selected from the group consisting of BCzVBi (4,4'-bis(9-ethyl-3-carbazovinylene)-1,1'-biphenyl), perylene, TBPe (2,5,8,11-tetra-tert-butylperylene), BCzVB (9H-carbazole-3,3'-(1,4-phenylenedi-2,1-ethenediyl)bis[9-ethyl-(9C)]), DPAVBi (4,4-bis[4-(di-p-tolylamino)-styryl] biphenyl), DPAVB (4-(di-p-tolylamino)-4'-[(di-p-tolylamino)styryl]stilbene), BDAVBi (4,4'-bis[4-(diphenylamino)styryl]biphenyl), BNP3FL (N,N'-bis(naphthalene-2-yl)-N,N'-bis(phenyl)-tris-(9,9-dimethylfluorenylene), 9,10-bis[(9-ethyl-3-carbazolyl) vinylenyl]anthracene, 4,4'-bis(diphenylvinylenyl)biphenyl, 1,4-bis(9-ethyl-3-carbazovinylene)-2-methoxy-5-(2-ethylhexyloxy)benzene, 4,4'-bis(diphenylvinylenyl)anthracene, 1,4-bis(9-ethyl-3-carbazovinylene)-9,9-dihexylfluorene, and also mixtures of the aforesaid substances. The stated emitter materials have their emission maximum in the blue spectral range.

In one embodiment, the emitter layer is subdivided into at least two sublayers. In this case it has at least one first sublayer (i.e., sublayer(s) of a first type) in which the matrix material comprises only the fluorescent, radiation-emitting emitter, but no phosphorescent exciton trap. Further, then, the emitter layer has at least one second sublayer (i.e., sublayer(s) of a second type), in which the matrix material comprises only the phosphorescent exciton trap, but no fluorescent, radiation-emitting emitter.

With an embodiment of this kind, triplet excitons are initially formed on the matrix material (or else on the exciton trap) and transferred to the phosphorescent exciton trap. The triplet excitons then diffuse in the direction of the interface between first and second sublayers, and, finally, are transferred to the fluorescent emitter.

In one variant, a sublayer which comprises (only) the phosphorescent exciton trap is located between two sublayers which each comprise (only) the fluorescent emitter. In this case, the triplet excitons are able to diffuse undirectedly, from the molecules of the phosphorescent exciton trap, in all directions, and nevertheless arrive at an interface to the other sublayer.

Where there are two or more sublayers, the matrix material used for the respective sublayers may be the same or different. The matrix material which comprises the phosphorescent exciton trap is frequently matched in terms of triplet level to the triplet level of the exciton trap. The matrix material of a sublayer which on the cathode side borders the sublayer comprising the exciton trap, for example, may be the same material as that of a hole blocking layer, electron transport layer or electron injection layer in turn bordering this sublayer on the cathode side. A sublayer bordering the phosphorescent exciton trap on the anode side may have, for example, the same matrix material as an electron blocking layer, hole transport layer or hole injection layer in turn bordering this sublayer on the cathode side. Alternatively of course, the matrix material of the sublayer or sublayers comprising the fluorescent emitter may also consist of a matrix material which, while not corresponding to the above-described matrix material that borders these sublayers on the cathode side or anode side, respectively, is nevertheless selected from the matrix materials indicated above. Accordingly, any hole-blocking and electron-transporting matrix material is suitable in particular for a sublayer with fluorescent emitter that is arranged on the cathode side, and any electron-blocking and hole-transporting matrix material for a sublayer with fluorescent emitters that is arranged on the anode side. In both cases, moreover, the matrix material may be selected such that it also possesses exciton blocking properties. The effect of this is that excitons formed in the sublayer comprising the exciton trap cannot be transferred to the matrix material of the sublayer with the fluorescent emitter, but instead are transferred substantially only to the singlet level of the fluorescent emitter, where (in the vicinity of the interface between the sublayers) they are able to undergo radiative decay.

In an alternative embodiment, the emitter layer has no sublayers (each comprising only the fluorescent, radiation-emitting emitter and the matrix material, or only the phosphorescent exciton trap and the matrix material). In this case, the molecules of the phosphorescent exciton trap and those of the fluorescent emitter are distributed, for example, randomly through the whole emitter layer. Furthermore, the molecules of the fluorescent emitter and those of the phosphorescent exciton trap may each be present alongside one another in regions (which, of course, do not correspond to an entire sublayer). Furthermore, of course, mixtures are possible between a random distribution and an embodiment in which there are zones with phosphorescent exciton trap or with fluorescent emitter.

Typically, the fluorescent emitter and the phosphorescent exciton trap are each distributed randomly over the matrix material. However, there may also be concentration gradients in the emitter layer, meaning, for example, that regions in which the exciton trap is more highly concentrated alternate with regions in which the fluorescent emitter is more highly concentrated in relation; in the emitter layer, indeed, there may also only be regions (but still not representing a true sublayer) in which exciton trap exclusively is present, and regions in which the phosphorescent emitter exclusively is present. Herewith it is possible deliberately to formulate zones in which primarily excitons are formed, and/or zones in which primarily emission takes place.

Generally, as a result of the inventive (molecular) ratio between fluorescent, radiation-emitting emitter and phosphorescent exciton trap, it is possible to, for example, minimize the direct formation of triplet excitons on the fluorescent dopant, or triplet-triplet annihilation on the phosphorescent exciton trap.

In embodiments, the weight fraction of the phosphorescent exciton trap is at least four times, frequently indeed at least eight times, as high as that of the fluorescent, radiation-emitting emitter.

In a further embodiment, the fraction of the phosphorescent exciton trap is 10%-20% by weight (in the context of the present invention, all figures in % by weight are always based on the matrix material present in the emitter layer). Above a weight fraction of at least 10% by weight, the matrix material contains sufficient exciton trap to allow highly efficient transport of the charge carriers, and therefore a significant increase in the current efficiency is recorded. Above a fraction of 20% by weight, there may in certain circumstances be an increased incidence of efficiency losses due to interactions of two excitons.

In a further embodiment, the fraction of the fluorescent emitter is 1%-4% by weight. Above a weight fraction of 5% by weight, and depending on the particular emitter, there is a likelihood of concentration quenching and therefore of a significantly dropping efficiency.

In one embodiment, the phosphorescent exciton trap has the emission maximum at a shorter wavelength than the radiation-emitting emitter.

This ensures, in general, that an efficient energy transfer cascade can take place from the phosphorescent exciton trap to the singlet level of the fluorescent emitter. More particularly, the triplet level of the matrix material ($T1_{matrix}$) ought to be higher than the triplet level of the exciton trap ($T1_{excitontrap}$) which in turn ought to be higher than the singlet level of the fluorescent emitter ($S1_{emitter}$) As described, the triplet excitons are then formed on the matrix material, and transferred to the phosphorescent exciton trap, which then transfers the triplet excitons to the singlet state of the fluorescent emitter (and, in particular, is not able to give them up to the matrix material of a sublayer with the fluorescent emitter—where sublayers of the emitter layer are present and where these sublayers comprise different matrix materials).

In a further embodiment, the difference in the wavelengths of the emission maximum of the radiation-emitting emitter and the emission maximum of the exciton trap amounts to 1 nm to 100 nm, preferably at least 15 nm or even at least 30 nm to 100 nm. Then, generally speaking, an efficient energy transfer cascade is likewise possible.

In a further embodiment, a feature of the radiation-emitting device is that the average life of the emitter layer (at a luminance of 300 cd/m$^2$) relative to the average life of a radiation-emitting device which differs only in that the emitter layer comprises only the phosphorescent exciton trap (and not the fluorescent emitter) is increased by at least 50 percent. In many cases, indeed, an increase in the average life by 100 percent can be observed. Increases of up to 300 percent or of up to 500 percent are also observed.

The radiation-emitting device of the invention in this case (at a luminance of 300 cd/m$^2$) generally has an average life of at least 10 000 hours, frequently at least 20 000 hours. Even lives of 50 000 hours can be realized.

In a further embodiment, the radiation emitted by the emitter layer is generated substantially by the radiation-emitting emitter. Owing to the very good charge carrier conductivity and exciton conductivity of the phosphorescent exciton trap, the excitons formed in the matrix material or on the phosphorescent exciton trap are transferred to a large degree to the fluorescent emitter material, as may be ascertained, for example, from the emission spectrum. The intensity of the normalized emission of the emission maximum of the exciton trap, in a spectrum measured for the emitter layer with exciton trap and radiation-emitting emitter, is typically not more than 40% of the intensity of the emission maximum of the radiation-emitting emitter, frequently not more than 20%. Usually, indeed, the intensity of the emission maximum of the exciton trap is only not more than 10%, frequently, indeed, not more than 5%, of the intensity of the emission maximum of the radiation-emitting emitter. The intensity ratios measured are in this case typically independent of the current density, especially at current densities of between 0.5 and 10 mA/cm$^2$.

Typically, moreover, it is the case that the intensity of the emission maximum of the phosphorescent exciton trap, in an emitter layer with exciton trap and radiation-emitting emitter, is also significantly reduced as compared with the intensity of the emission maximum of an emitter layer which comprises only the exciton trap (in the same concentration as in the "mixed" system identified above) and comprises no radiation-emitting emitter material (and also no sublayers). The intensity (measured at the same current density of, for example, 5 mA/cm$^2$) of the normalized emission of the emission maximum of the exciton trap in the emitter layer with emitter and exciton trap is typically in that case not more than 40%, usually not more than 20%, frequently not more than 10%, and often indeed not more than 5% of the normalized emission of the emission maximum of the exciton trap in a layer which consists only of the matrix material and the exciton trap. As was described above, this can be attributed substantially to the good exciton conductivity of the exciton trap. The intensity ratios measured are in this case typically independent of the current density, particularly at current densities of between 0.5 and 10 mA/cm$^2$.

In the majority of embodiments, the light emitted by the emitter layer brings about substantially the same perceived color as the light emitted by an emitter layer without exciton traps (and also without sublayers). A substantially identical perceived color in this context means in particular that the CIE coordinates of the light emitted by an emitter layer without exciton trap ($x_{oE}$, $y_{oE}$) are not substantially different from those for an emitter layer with exciton trap ($x_{mE}$, $y_{mE}$). As a general rule it is the case, for the difference $\Delta x = x_{oE} - x_{mE}$ and for the difference $\Delta y = y_{oE} - y_{mE}$, that $\Delta x < 0.05$ and/or $\Delta y < 0.05$. Frequently, indeed, $\Delta x < 0.03$ and/or $\Delta y < 0.03$, and in many cases also $\Delta x < 0.01$ and/or $\Delta y < 0.01$. For the sum of the absolute amounts of these differences $\Sigma_A = |\Delta x| + |\Delta y|$, it is generally the case that $\Sigma_A < 0.08$, frequently $\Sigma_A < 0.05$, and often also $\Sigma_A < 0.01$.

The effective transfer of the excitons from the exciton trap to the dopant may be determined by means of the time-resolved, wavelength-dependent emission spectra. If comparison is made here between an emitter layer comprising a phosphorescent exciton trap and a fluorescent emitter material and an identical layer comprising in the same concentrations in each case only the exciton trap (and also no sublayers) or only the radiation-emitting emitter material (and also no sublayers), then it is found that the half-life of the intensity of the emission of the emission maximum of the exciton trap in the "mixed system" has reduced, whereas the half-life of the intensity of the emission of the emission maximum of the fluorescent emitter material remains substantially the same or even increases somewhat.

In one preferred embodiment, in the emitter layer of the invention, the half-life of the excitons on the exciton trap is less than or equal to 10 μs, preferably less than or equal to 1 μs.

For systems of this kind, a particularly high singlet fraction is recorded in the triplet excitons formed.

The effects described above generally also mean that the external quantum efficiency of the emitter layer can be increased significantly. Where the external quantum efficiency of an emitter layer with phosphorescent exciton trap and fluorescent, radiation-emitting emitter is compared with the quantum efficiency of an emitter layer which comprises only the fluorescent emitter (at the same concentration) and no exciton trap, it is found that the quantum efficiency is usually increased by at least 20%. In many cases, indeed, an increase by 30% can be found. With the emitter layer of the invention, therefore, it is possible to attain external quantum efficiencies $\eta_{ext}$ of greater than 12%, in many cases, indeed, of greater than 14%. It is even possible to attain quantum efficiencies between more than 18%, e.g., of 20%.

Frequently, moreover, it is the case that the quantum efficiency of the emitter layer of the invention amounts to at least 75 percent of the quantum efficiency of an emitter layer which comprises only the fluorescent emitter and no phosphorescent exciton trap (and also no sublayers). In many instances, indeed, it is the case that the quantum efficiency of the emitter layer of the invention is equal to or higher than that of the aforementioned emitter layer which comprises only the fluorescent emitter.

In a further refinement, the radiation-emitting emitter present in the emitter layer has a high photoluminescence quantum yield, not least at low concentrations of the fluorescent emitter. Furthermore, the excitons on the fluorescent, radiation-emitting emitter material possess a relatively short life. This life in general is not more than 100 ns.

In a further refinement, the emitter layer (optionally containing sublayers) of the radiation-emitting device has a layer thickness of 10-40 nm. Emitter layers with lower thicknesses are more difficult to process; moreover, above a layer thickness of 10 nm, it is possible to optimize the number of emitter centers and therefore to adapt them more effectively to the life of the excitons. However, a layer thickness of between 5 and 10 nm may also be technically rational. Especially if the emitter layers have 2, 3 or more sublayers, the thickness of the individual sublayers will frequently be 5-10 nm. For the production of a radiation-emitting device which emits white light and which comprises not only the emitter layer of the invention, emitting blue or violet light, but also further emitter layers, the thickness of the individual emitter layers is preferably in each case 10-20 nm.

In a further embodiment, therefore, the radiation-emitting device may have at least one further emitter layer, frequently a total of at least two or three emitter layers. An arrangement of this kind is suitable in particular for producing a radiation-emitting device which emits white light. This white light may be formed by the overlap of the radiation emitted by the first emitter layer and that emitted by at least one further emitter layer. For this purpose it is usual to use at least three emitter layers (for example, emitter layers each emitting in the red, green, and blue spectral ranges). Also conceivable, however, is a system which contains only two emitter layers (for example, a blue-emitting layer and an orange-emitting layer). In accordance with the invention here, and generally, the various spectral ranges are defined as follows: red spectral range about 640 to 780 nm, orange spectral range about 600 to 640 nm, yellow spectral range about 570 to 600 nm, green spectral range about 500 to 570 nm, blue spectral range about 430 to 500 nm, violet spectral range about 380 to 430 nm.

In a further embodiment of the present invention there are blocking layers between each pair of emitter layers identified in the paragraph above. Where the radiation-emitting device comprises more than two emitter layers, there may be a blocking layer between all the emitter layers, or else only between some of the emitter layers. A blocking layer of this kind may serve to block excitons and may in that case be of a design such that its thickness is greater than the average free path length of the excitons formed in the adjacent layer, thereby substantially preventing these excitons from entering the second layer. Furthermore, alternatively or simultaneously, the blocking layer may also serve, at least in parts of the layer, for blocking charge carriers (electrons or holes). By means of layers or subregions of layers that block charge carriers, the charge carrier density can be set in a specific way. A blocking layer for blocking excitons and/or charge carriers may comprise or consist of one or more matrix materials, with suitable matrix materials being selectable from the matrix materials disclosed above. Alternatively, layers which block electrons may comprise one or more of the materials below for hole transport layers, or may comprise said material or materials and one or more matrix materials. Furthermore, layers which block holes may comprise one or more of the materials below for electron transport layers, or may comprise said material or materials and one or more matrix materials.

In one embodiment, the radiation-emitting device is an OLED and may take the form more particularly of a lighting means or a display, and may have an active lighting area of large-area design. "Large-area" here may mean that the component has an area of greater than or equal to a few square millimeters, preferably greater than or equal to one square centimeter, and more preferably greater than or equal to one square decimeter.

The radiation-emitting device of the invention may have other functional layers. Such layers may be, for example, electron transport layers, electron injection layers, hole transport layers and/or hole injection layers. Such layers may serve to increase further the efficiency of the radiation-emitting device and may be formed at one or more appropriate sites in the radiation-emitting device. They may comprise suitable electron transport materials and/or hole transport materials and/or materials suitable for improving hole injection, and also materials for blocking excitons or charge carriers. Electron transport materials include, for example, Liq (8-hydroxyquinolinolatolithium), TPBi (2,2',2"-(1,3,5-benzenetriyl)tris(1-phenyl-1H-benzimidazole)), PBD (2-(4-biphenylyl)-5-(4-tert-butylphenyl)-1,3,4-oxadiazole), BCP (2,9-dimethyl-4,7-diphenyl-1,10-phenanthroline), BPhen (4,7-diphenyl-1,10-phenanthroline), BAlq (bis(2-methyl-8-quinolinolate)-4-(phenylphenolato)aluminum), TAZ (3-(4-biphenylyl)-4-phenyl-5-tert-butylphenyl-1,2,4-triazole), CzSi (3,6-bis(triphenylsilyl)carbazole), NTAZ (4-(naphth-1-yl)-3,5-diphenyl-4H-1,2,4-triazole), Bpy-OXD (1,3-bis[2-(2,2'-bipyrid-6-yl)-1,3,4-oxadiazol-5-yl]benzene), BP-OXD-Bpy (6,6'-bis[5-(biphenyl-4-yl)-1,3,4-oxadiazol-2-yl]-2,2'-bipyridyl), PADN (2-phenyl-9,10-di(naphth-2-yl)anthracene), Bpy-FOXD (2,7-bis[2-(2,2'-bipyrid-6-yl)-1,3,4-oxadiazol-5-yl]-9,9-dimethylfluorene), OXD-7 (1,3-bis[2-(4-tert-butylphenyl)-1,3,4-oxadiazol-5-yl]benzene), HNBphen (2-(naphth-2-yl)-4,7-diphenyl-1,10-phenanthroline), NBphen (2,9-bis(naphth-2-yl)-4,7-diphenyl-1,10-phenanthroline), 3TPYMB (tris(2,4,6-trimethyl-3-(pyrid-3-yl)phenyl)borane), and 2-NPIP (1-methyl-2-(4-(naphth-2-yl)phenyl)-1H-imidazo[4,5-f] [1,10]phenanthroline) and also mixtures of the aforesaid substances. For the electron transport layer (which may serve at the same time as exciton blocking layer and/or hole blocking layer) preference is given to substances selected from the group consisting of TPBi, BCP, Bphen, CzSi, and TAZ, and also mixtures of these substances.

Hole transport materials include, for example, NPB (N,N'-bis(naphth-1-yl)-N,N'-bis(phenyl)benzidine), β-NPB (N,N'-bis(naphth-2-yl)-N,N'-bis(phenyl)benzidine), TPD (N,N'-bis(3-methylphenyl)-N,N'-bis(phenyl)benzidine), N,N'-bis(naphth-1-yl)-N,N,-bis(phenyl)-2,2-dimethylbenzidine, Spiro-TPD (N,N'-bis(3-methylphenyl)-N,N'-bis(phenyl)-9,9-spirobifluorene), Spiro-NPB (N,N'-bis(naphth-1-yl)-N,N'-bis(phenyl)-9,9-spirobifluorene), DMFL-TPD (N,N'-bis(3-methylphenyl)-N,N'-bis(phenyl)-9,9-dimethylfluorene), DMFL-NPB (N,N'-bis(naphth-1-yl) -N,N-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphth-1-yl)-N,N'-bis(phenyl)-9,9-diphenylfluorene), Sp-TAD (2,2',7,7'-tetrakis(N,N-diphenylamino)-9,9'-spirobifluorene), TAPC (di[4-(N,N-ditolylamino)phenyl]cyclohexane), Spiro-TTB (2,2',7,7'-tetra(N,N-ditolyl)aminospirobifluorene), BPAPF (9,9-bis[4-(N,N-bisbiphenyl-4-ylamino)phenyl]-9H-fluorene), Spiro-2NPB (2,2',7,7'-tetrakis[N-naphthyl(phenyl)amino]-9,9-spirobifluorene), Spiro-5 (2,7-bis[N,N-bis(9,9-spirobifluoren-2-yl)amino]-9,9-spirobifluorene), 2,2'-Spiro-DBP (2,2'-bis[N,N-bis(biphenyl-4-yl)amino]-9,9-spirobifluorene), PAPE (N,N'-bis(phenanthren-9-yl)-N,N'-bis(phenyl)benzidine), TNB (N,N,N',N'-tetranaphth-2-ylbenzidine), Spiro-BPA (2,2'-bis(N,N-diphenylamino)-9,9-spirobifluorene), NPAPF (9,9-bis[4-(N,N-bisnaphth-2-ylamino)phenyl]-9H-fluorene), NPBAPF (9,9-bis[4-(N,N'-bisnaphth-2-yl-N,N'-bisphenylamino)phenyl]-9H-fluorene), TiOPC (titanium oxide phthalocyanine), CuPC (copper phthalocyanine), F4-TCNQ (2,3,5,6-tetrafluoro-7,7,8,8-tetracyanoquinodimethane), m-MTDATA (4,4',4''-tris(N-3-methylphenyl-N-phenylamino)triphenylamine), 2T-NATA (4,4',4''-tris(N-(2-naphthyl)-N-phenylamino)triphenylamine), 1T-NATA (4,4',4''-tris(N-(1-naphthyl)-N-phenylamino)triphenylamine), NATA (4,4',4''-tris(N,N-diphenylamino)triphenylamine), PPDN (pyrazino[2,3-f][1,10]phenanthroline-2,3-dicarbonitrile), MeO-TPD (N,N,N',N'-tetrakis(4-methoxyphenyl)benzidine), MeO-Spiro-TPD (2,7-bis[N,N-bis(4-methoxyphenyl)amino]-9,9-spirobifluorene), 2,2'-MeO-Spiro-TPD (2,2'-bis[N,N-bis(4-methoxyphenyl)amino]-9,9-spirobifluorene), β-NPP (N,N'-di(naphth-2-yl)-N,N'-diphenylbenzene-1,4-diamine), NTNPB (N,N'-diphenyl-N,N'-di[4-(N,N-ditolylamino)phenyl]benzidine), and NPNPB (N,N'-diphenyl-N,N'-di[4-(N,N-diphenylamino)phenyl]benzidine), or mixtures of the aforesaid substances. For the hole transport layer (which likewise may serve simultaneously as exciton blocking layer and/or electron blocking layer), preference is given to substances selected from the group consisting of NPB, TCTA, TPD, Sp-TAD, and TAPC, and also mixtures of these substances.

Examples of materials suitable for improving hole injection include CuPC (phthalocyanine, copper complex), TiOPC (titanium oxide phthalocyanine), m-MTDATA (4,4',4''-tris(N-3-methylphenyl-N-phenylamino) triphenylamine), 2T-NATA (4,4',4''-tris(N-(2-naphthyl)-N-phenylamino) triphenylamine), 1T-NATA (4,4',4''-tris(N-(1-naphthyl)-N-phenylamino)triphenylamine), NATA (4,4',4''-tris(N,N-diphenylamino)triphenylamine), and also mixtures of the aforementioned substances, it being possible optionally for the materials indicated to be doped.

DETAILED DESCRIPTION OF THE DRAWINGS

Figure 1:
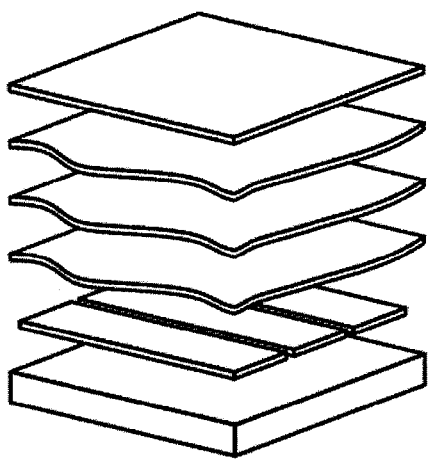
FIG. 1 shows a schematic overview of a radiation-emitting device in accordance with an embodiment of the present invention.
Figure 1:
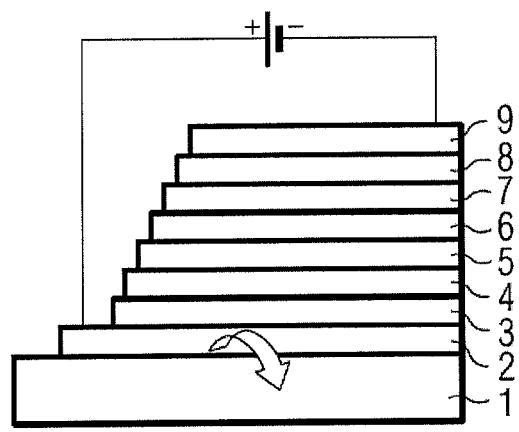

FIG. 1 shows the schematized layer construction of an organic, radiation-emitting component. From bottom to top, the following layer construction is realized: at the very bottom is the substrate 1, which may, for example, be transparent and may also be made of glass. Atop it is a lower electrode layer 2, which may, for example, be a transparent conductive oxide such as indium tin oxide (ITO). This lower electron layer may function as anode or as cathode. Disposed above this electrode layer 2 is a hole injection layer 3, above which in turn is disposed a hole transport layer 4. Disposed above the hole transport layer 4 is the organically active layer, the emission layer 5. Where the radiation-emitting device comprises more than one emission layer 5, the first emission layer is followed by the further emission layers, optionally separated by exciton blocking layers.

Lying on the emission layer or on the two or more emission layers is the hole-blocking layer 6, disposed on which are the electron transport layer 7 and, finally, the electron injection layer 8 with adjacent upper electrode 9. The upper electrode 9 may be, for example, a metal electrode or a further transparent electrode, made for example of one of the transparent conductive oxides specified above. The depiction of sublayers of the emitter layer of the invention has been omitted on grounds of clarity.

When a voltage is applied between the top and bottom electrodes, current flows through the component, and photons are released in the organically active layer, these photons departing the component in the form of light via the transparent electrode or electrodes.

Provided in a matrix in the emission layer 5, in accordance with the invention, are one or more phosphorescent exciton traps and one or more fluorescent, radiation-emitting emitters (the latter in particular at low concentration).

A radiation-emitting component of this kind may be produced, for example, as follows: first of all, HF sputtering is used to deposit an ITO layer as anode on a glass plate. For the deposition of the other functional layers, this substrate is introduced into a recipient, which contains a plurality of sources in which organic material (especially for use as an exciton trap and also for use as a radiation-emitting emitter) can be evaporated to produce the individual functional layers of the radiation-emitting device. In addition, one or more sources for the supply of one or more different matrix materials are provided. To form a hole injection layer, deposition takes place from a source with matrix material and from a source with a p-dopant, jointly, on the glass plate already carrying the anode. The joint deposition of dopant and matrix material takes place correspondingly for the hole transport layer. This is followed by the deposition of the emitter layer of the invention. For this purpose, a matrix material, the exciton trap, and the at least one radiation-emitting emitter material are deposited in unison or in succession.

In order to obtain a layer having substantially randomly distributed exciton trap molecules and molecules of the fluorescent emitter, matrix material, exciton trap, and emitter material are deposited simultaneously. In order to produce sublayers within the emitter layer of the invention, emitter material and exciton trap are not deposited simultaneously. For example, it is possible first of all to deposit matrix material and fluorescent emitter simultaneously (first sublayer), followed by phosphorescent exciton trap and matrix material (second sublayer), and lastly matrix material and fluorescent emitter (third sublayer). Further layers present, such as blocking layer, electron transport layer, and electron injection layer, are deposited analogously. Lastly, an aluminum layer is formed as a reflective electrode. Alternatively (aside from the electrode layers), the various functional layers may also be applied by means of a wet process (e.g., spincoating), which may be useful in particular if the layer to be applied comprises a polymer. Furthermore, it is also possible for the layers applied first to be applied by means of a wet process, and all subsequent layers to be applied by means of vapor deposition.

Indicated below is an exemplary embodiment for the production of an OLED which emits blue light. The schematic structure of this blue-emitting OLED is depicted in FIGS. 2 and 3.

The OLED which emits blue light has a 30 nm NPB hole transport layer atop the ITO anode. Arranged on the hole transport layer is a 10 nm TAPC exciton blocking layer, in order to prevent transfer of the excitons from the emitter layer to the less-efficient hole transport layer. Arranged on the LiF/Al cathode is an electron transport layer of TPBi, 30 nm thick. This layer carries in turn a 10 nm layer of Bphen which functions as an exciton blocking layer and hole blocking layer. The emitter layer itself comprises the matrix material TCTA, into which the blue-phosphorescent exciton trap fac-Ir(cn-pmic)$_3$ (energy levels in FIG. 2 characterized by dots) and the blue-fluorescent emitter DPAVBi (energy levels in FIG. 2 characterized by lines) have been introduced. The emitter layer has a thickness of 30 nm. The excitons are in this case first generated on the matrix material TCTA and transferred via the phosphorescent exciton trap Ir(pmb)$_3$ to the fluorescent emitter DPAVBi, where they can decay radiatively. In this exemplary embodiment, the exciton trap is present at a concentration of 20% by weight; as a result of this, there is good direct exciton formation and also very good transfer of excitons formed on the matrix material to the exciton trap. Furthermore, on account of the high concentration, the excitons are able to diffuse effectively to the fluorescent emitter molecules via the exciton trap molecules.

The triplet level of the phosphorescent exciton trap (and also that of the matrix) can be calculated from the emission wavelength of the phosphorescence (of the matrix or the exciton trap). The singlet level of the fluorescent emitter can be determined by measuring the emission wavelength at room temperature.

Figure 2:
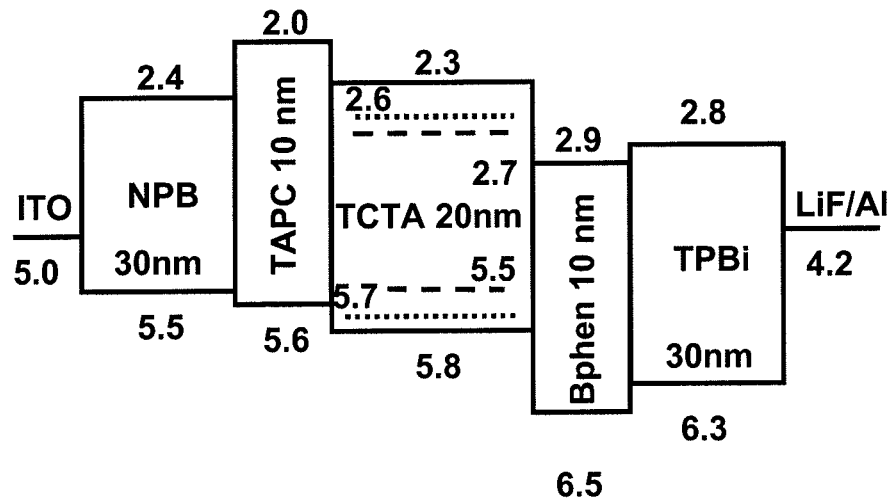
FIG. 2 shows a schematic representation of the energy levels of one embodiment of an OLED structure in accordance with the present invention (without sublayers).
Figure 3:
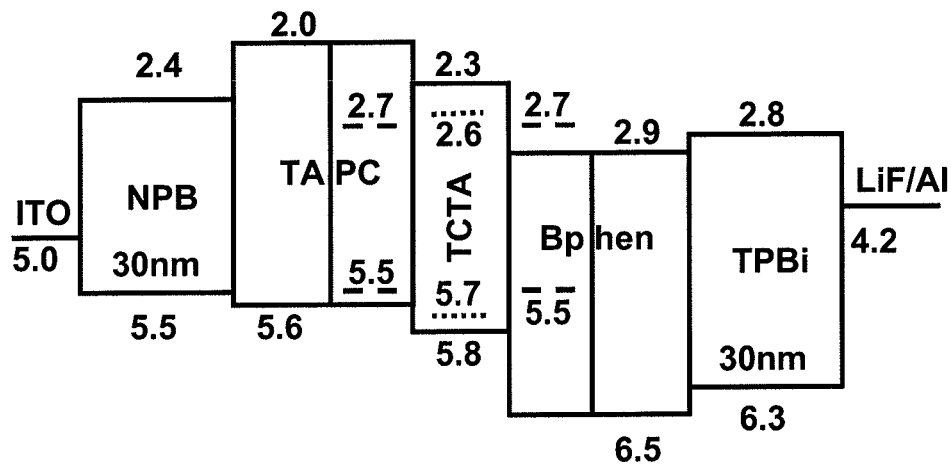
FIG. 3 shows a schematic representation of the energy levels of a further embodiment of an OLED structure in accordance with the present invention, having a first sublayer comprising the fluorescent, radiation-emitting emitter, and a second sublayer comprising the phosphorescent exciton trap.

FIG. 3 shows a construction which corresponds to that of FIG. 2; however, the emitter layer here is formed by three sublayers. The phosphorescent exciton trap fac-Ir(pmb)$_3$ is located (at a concentration of 20% by weight) in the middle layer, which is 10 nm thick and made of the matrix material TCTA. Bordering on this layer are two layers, each 10 nm thick, containing the fluorescent emitter DPAVBi. The sublayer which borders the middle sublayer of the emitter layer on the anode side has TAPC as its matrix material; the sublayer bordering it on the cathode side has Bphen as its matrix material. The energy levels of the phosphorescent exciton trap are characterized in each case by dots, those of the fluorescent emitter by lines. In this embodiment, therefore, excitons are formed on the matrix material TCTA (and also on the exciton trap), and are then able in the direction of the interfaces to the respective bordering sublayers, the excitons cannot be given up to the matrix material of the fluorescent emitter molecules, and so are transferred to the singlet state of the fluorescent emitter, and are able here to undergo radiative decay.

The invention is not confined by the description with reference to the exemplary embodiments. Instead, the invention encompasses each new feature and also every combination of features, including more particularly every combination of features in the claims, even when said feature or said combination itself is not explicitly stated in the claims or exemplary embodiments.

The invention claimed is:

1. A radiation-emitting device comprising:
   a substrate;
   a first electrode and a second electrode; and
   at least one emitter layer arranged between the first and second electrodes and emitting light in the violet or blue spectral range, wherein the emitter layer comprises a matrix material and, relative to the matrix material, 0.1% - 5% by weight of a fluorescent, radiation-emitting emitter and 1-30% by weight of a phosphorescent exciton trap, wherein the fluorescent, radiation-emitting emitter and the phosphorescent exciton trap are distributed through the whole emitter layer;
   wherein the emission maximum of the fluorescent emitter and that of the phosphorescent exciton trap being situated in the blue, violet or ultraviolet spectral range.

2. The radiation-emitting device according to claim 1, wherein the exciton trap has an emission maximum at a shorter wavelength than the radiation-emitting emitter.

3. The radiation-emitting device according to claim 1, wherein the triplet level of the matrix $T1_{matrix}$ is higher than the triplet level of the exciton trap $T1_{excitontrap}$ and/or the triplet level of the exciton trap $T1_{excitontrap}$ is higher than the singlet level of the radiation-emitting emitter $Sl_{emitter}$.

4. The radiation-emitting device according to claim 1, wherein the difference in the wavelength of the emission maxima amounts at most to 1-100 nm.

5. The radiation-emitting device according to claim 1, wherein the average life of the emitter layer, at a luminance of 300 cd/m$^2$, is increased by at least 50% over that of an emitter layer containing only the phosphorescent exciton trap.

6. The radiation-emitting device according to claim 1, wherein the average life of the emitter layer at a luminance of 300 cd/m$^2$ is at least 10 000 h.

7. The radiation-emitting device according to claim 1, wherein the radiation emitted by the emitter layer is generated substantially by the radiation-emitting emitter.

8. The radiation-emitting device according to claim 1, wherein the intensity of the normalized emission of the emission maximum of the exciton trap in the emitter layer is not more than 20% of the intensity of the emission maximum of the radiation-emitting emitter.

9. The radiation-emitting device according to claim 1, wherein the half-life of the excitons on the exciton trap in the emitter layer is less than or equal to 10 µs.

10. The radiation-emitting device according to claim 1, wherein the external quantum efficiency $\eta_{ext}$ of the emitter layer is increased by at least 20% relative to that of an emitter layer which comprises only the phosphorescent exciton trap.

11. The radiation-emitting device according to claim 1, having at least one further emitter layer, which emits light in the green, yellow, orange and/or red spectral range.

12. The radiation-emitting device according to claim 11, wherein an overlap of the radiation emitted by the first emitter layer and that emitted by the at least one further emitter layer results in emission of white light.

13. The radiation-emitting device according to claim 1, wherein the average life of the emitter layer at a luminance of 300 cd/m$^2$ is at least 20 000 h.

14. The radiation-emitting device according to claim 1, wherein the intensity of the normalized emission of the emission maximum of the exciton trap in the emitter layer is not more than 10% of the intensity of the emission maximum of the radiation-emitting emitter.

15. The radiation-emitting device according to claim 1, wherein the fluorescent, radiation-emitting emitter and the phosphorescent exciton trap are distributed randomly through the whole emitter layer.

16. The radiation-emitting device according to claim 1, wherein concentration gradients are present in the emitting layer.

* * * * *